United States Patent [19]

Olsen

[11] Patent Number: 4,879,661
[45] Date of Patent: Nov. 7, 1989

[54] BI-DIRECTIONAL CIRCUIT TO INTERFACE BETWEEN A LOW CURRENT DEVICE AND HIGH CURRENT TESTER

[75] Inventor: Floyd W. Olsen, Endicott, N.Y.

[73] Assignee: International Business Machines Corporation, Armonk, N.Y.

[21] Appl. No.: 104,326

[22] Filed: Oct. 2, 1987

[51] Int. Cl.[4] ............................ G01R 19/00; H03M 5/00
[52] U.S. Cl. ................................. 364/483; 324/73 R; 364/481; 341/50
[58] Field of Search ....................... 324/73 R, 73 AT; 340/347 DD; 364/481, 483, 550

[56] References Cited

U.S. PATENT DOCUMENTS

| | | | |
|---|---|---|---|
| 4,023,097 | 5/1977 | Hanashey | 324/73 R |
| 4,255,792 | 3/1981 | Das | 364/481 |
| 4,502,127 | 2/1985 | Garcia et al. | 364/481 |
| 4,523,312 | 6/1985 | Takeuchi | 324/73 R |
| 4,574,234 | 3/1986 | Inbar | 324/73 R |
| 4,608,647 | 8/1986 | White et al. | 364/481 |
| 4,630,224 | 12/1986 | Sollman | 364/481 |
| 4,651,088 | 3/1987 | Sawada | 324/73 R |
| 4,686,627 | 8/1987 | Donovan et al. | 364/481 |
| 4,694,242 | 9/1987 | Peterson et al. | 324/73 R |

Primary Examiner—Parshotam S. Lall
Assistant Examiner—Kevin J. Teska
Attorney, Agent, or Firm—Douglas M. Clarkson

[57] ABSTRACT

A circuit to function as an interface between larger test instrumentation having a high capacitance, including connecting leads, and a small, low current, monolithic chip device. This interface circuit has no internal control logic, is capable of transactions in both directions and is small itself, thereby fitting close to the monolithic chip device and reflecting a relatively low capacitance load to the chip.

The interface circuit includes an input buffer amplifier connected to provide a driving voltage to drive the test instrumentation in response to a voltage from the small monolithic chip device, and a sensing resistor is connected with the input buffer amplifier so that their combined equivalent resistance value is substantially equal to the resistance reflected by the test instrumentation. An operational amplifier is connected to drive a small monolithic chip device in response to a voltage across the sensing resistor that is developed by the test instrumentation.

12 Claims, 2 Drawing Sheets

BI-DIRECTIONAL CIRCUIT TO INTERFACE BETWEEN A LOW CURRENT DEVICE AND HIGH CURRENT TESTER

BACKGROUND OF THE INVENTION

The present invention, generally, relates to interface circuits providing a buffer between two circuits that have a need to communicate and, more particularly, to a circuit to interface between a small, low current device-under-test and larger test instrumentation requiring relatively high current input to function.

One need for such an interface buffer has developed in the manufacture of micro chips with multiple circuits, and another need has arisen in the industry that provides service for equipment that utilizes these very small chips. In recent years, the electronics industry has improved, grown and developed in its advance of the technology it uses, and the field of miniturization is advancing now with matching speed.

For example, one monolithic chip measuring less than one-half inch square today can store one million bits of information, and in addition, such a chip can have many electronic circuits. Placing more and more electronic circuits on smaller and smaller chips makes the task of testing such circuits approach the impossible.

A typical data processor chip has 64 pins on its terminal connector, and it is not unusual for such a chip to require 60 test instruments connected to it at the same time. For example, there are electronic test instrumentation that measure accurately plus and minus electric current, voltage, electric pulse rise and fall time, and plus and minus voltage levels at prescribed values, just to mention a few.

While the monolithic chip, as a typical device-under-test, may measure only a fraction of an inch, most of the test instrumentation are in housings that are measured in feet, because there must be, for example, meters to be viewed and switches to be manipulated, even though a test circuit itself is miniaturized. Therefore, such larger size test instrumentation makes it necessary to have longer wires connecting the device-under-test to the test instrumentation in order to perform the needed tests.

Even though the test instrumentation can readily have built in suitable circuits to compensate for any capacitance that may be reflected at its input terminals, there cannot be built into the test instrumentation circuits anything to compensate for the capacitance in the wires connecting the test instrumentation to the device-under-test. It is these "long wires" with their characteristic impedance that has presented a problem.

The transmission lines created electrically by these "long wires", particularly with co-axial cable, usually have "n" pico farads per foot of capacitance, which adds up quickly and can total 100 to 150 pico farads typical. Three or four feet of such "long wires" is all it takes.

Due to the operating currents of a typical monolithic chip, as an example of a device-under-test, being measured in micro amperes, it is absolutely necessary to use co-axial cable to connect the test instrumentation, because un-shielded wires cause errors in signal transmission due to the inductance effect at the fast signal speeds that are involved. As has been pointed out above, co-axial cable has higher capacitance than other forms of connecting wires, and since its use is dictated by operating conditions, the problem is compounded.

One solution that has been attempted in the prior art is to use a "lossey line" to connect a device-under-test to the various test instrumentation. However, using a "lossey line" with its high frequency effective low capacitance per foot, the resulting degraded signals were found to create more problems than those solved by the low capacitance of the line.

Due to the degraded signals caused by a "lossey line", the accuracy of signals is poor, they develop delays and loss of speed, and a requirement of testing at low speeds causes poor testing accuracy for such a tiny circuit as the device-under-test. A circuit such as the present device-under-test is too small and lacks sufficient power to drive a high capacitance load and, also, cannot accept reflected signals.

Therefore, the problems have remained, until the present invention which, unlike a passive "lossey line", provides an active interface between the test instrumentation and a device-under-test by providing the current needed to drive the high capacitance load while, at the same time, providing a buffer against any reflected signals.

OBJECTS AND SUMMARY OF THE INVENTION

It is an important object of the present invention to provide an interface between a low current device-under-test and test instrumentation.

An equally important object of the invention is to provide an interface between a device-under-test and test instrumentation that functions also as a buffer to isolate the device-under-test from harm during test.

Another object of the invention is to provide an interface between a device-under-test and test instrumentation that will function effectively bi-directionally.

Still another object of the present invention is to provide a bi-directional buffer to function effectively as an interface between a device-under-test and test instrumentation without control lines.

Briefly, an interface that is constructed in accordance with the present invention has an input buffer amplifier connected to provide a driving voltage for test instrumentation in response to a voltage output signal from a monolithic circuit device. A sensing resistor of a value which, together with the resistive component of the internal impedance of said input buffer amplifier, matches the resistance reflected at the terminals of test instrumentation. An operational amplifier connected in said interface to drive said monolithic circuit device in response to a voltage developed across said sensing resistor by test instrumentation.

Other features of the invention as well as additional objects and advantages will become more apparent from the following detailed description in which several embodiments are set forth in detail in conjunction with the accompanying drawings.

DETAILED DESCRIPTION OF THE INVENTION

Figure 1:
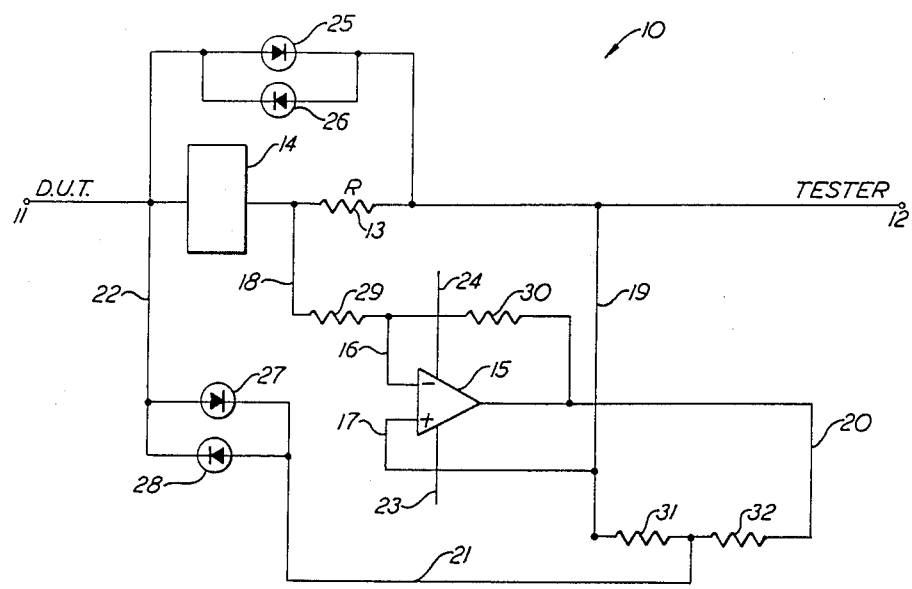
FIG. 1 is a bi-directional circuit with its respective component parts connected and arranged in accordance with the principles of the present invention.

Referring first to FIG. 1 of the drawings, a circuit is identified by the reference numeral 10. The circuit 10 is bi-directional, i.e., its two terminals 11 and 12 are either input terminals or output terminals, depending upon the direction of signal flow at a given instant in its operating cycle, as will be described in more detail presently. The only important aspect of the two terminals 11 and 12 is that a device-under-test must always be connected to the terminal 11, and all test instrumentation must be connected to the terminal 12.

A still further characteristic of the circuit 10 is that it is intended as primarily an interface between a device-under-test (sometimes called "d.u.t." hereinafter) that lacks the ability to furnish sufficient current to drive a high capacitance load and larger test instrumentation that cannot always be connected to avoid current and-/or voltage peaks that can be harmful to a d.u.t. with these characteristics. Such a circuit as the circuit 10 of the present invention will function effectively, therefore, as a buffer in order to isolate a small, low current device-under-test and various test instrumentation from each other.

Connected directly in line between the two terminals 11 and 12 is a sensing resistor 13 and an input current amplifier 14. The input amplifier 14 functions effectively also as a buffer in order to isolate the two terminals 11 and 12 from a direct connection to each other.

The input amplifier 14 has, of course, a characteristic internal impedance and the resistive component of this impedance, together with the value of the sensing resistor 13, are arranged to total a predetermined value in order to match the resistance reflected at the terminal 12 by the test instrumentation. How to arrive at a correct value for the sensing resistor 13 will be described in more detail hereinafter.

An operational amplifier 15 is connected with its input terminals responsive to the voltage developed across the sensing resistor 13. A negative input terminal 16 and a positive input terminal 17 are connected across the sensing resistor 13 by way of lines 18 and 19, respectively. Therefore, by this arrangement, the input to the operational amplifier 15 is connected to be responsive to the test instrumentation at the terminal 12.

The output from the operational amplifier 15 is connected to the device-under-test at the terminal 11 by means of lines 20, 21 and 22, respectively. A suitable supply voltage for the operational amplifier 15 is connected at terminals 23 and 24, the negative voltage at terminal 23 and positive at terminal 24.

A pair of diodes 25 and 26 are connected in a back-to-back arrangement across the input amplifier 14 and the sensing resistor 13 to function as "by-pass diodes". In this back-to-back arrangement, the diodes represent a circuit without polarity. A similar pair of diodes 27 and 28 are connected, also in a back-to-back arrangement, between the lines 21 and 22 in the output circuit of the operational amplifier 15.

The diodes serve a basic and important function by providing incremental current instead switching during test instrumentation dominate mode voltage level slewing transistions for the amplifier 14. In addition, the diodes also provide a way of controlling the current to the D.U.T. during the test instrumentation dominate mode voltage level triming transitions for the amplifier 15, and by so doing, assist in one of the primary functions of the interface circuit 10, which is to provide a buffer between the terminals 11 and 12.

To complete an identification of the respective components of the circuit 10 in FIG. 1, there are four resistor 29, 30, 31 and 32, forming two resistor networks. The two resistors 29 and 30 form one network between the negative input terminal 16 and the output of the operational amplifier 15, and the two resistors 31 and 32 form a network between its output and the positive input terminal 17. These resistors in the two networks are required in accordance with Thevenin's Theorem relating to linear bilateral impedances and voltage and-/or current generators in a circuit.

The interface circuit 10 is an effective, high speed analog bi-directional buffer, and with the particular values for the respective component parts to be identified more specifically hereinafter, it operates at 20 MHz, or higher. As will be understood from the detailed description of other embodiments of the circuit 10 hereinafter, different values can be assigned readily to the respective component parts, but one set of such values is as follows:

The sensing resistor $R_{13}$ is 36.3 Ohms, and the resistors $R_{31}$ and $R_{32}$ are each 200 Ohms. The resitor $R_{29}$ is 330 Ohms, and the resistor $R_{30}$ is 1000 Ohms. The input current amplifier 14 is an LH0002 Buffer Amplifier that is available commercially from National Semiconductor Corporation of Santa Clara, Calif., and the operational amplifier 15 is a HA-2050 available from Harris Semiconductor Corporation of Melbourne, Fla.

The diodes 25 and 26; 27 and 28 can be any suitable silicon diode, or a diode of another material, or the circuit does not have to be diodes. Therefore, to define the function of the "diode" in the circuit 10, whatever is selected here must operate in accordance with the following relationship:

$$V_f = A + BI_f + C \ln I_f \qquad (1)$$

where:

$V_f$ = the voltage forward
A = a constant (the voltage before conduction)
B = electrical resistance, foward
C = a constant, from manufacturer
I = electrical current in direction of arrow
ln = natural log function The following procedure has been found to operate effectively in predetermining the value for the sensing resistor $R_{13}$:

Determine the impedance reflected by the test instrumentation connected at the terminal 12. (In the case illustrated by the values for this circuit 10, it was 50 Ohms)

Next, determine the high frequency output impedance. of the input current amplifier 14. (In this case, it was found to be 14.43 Ohms which, when Thevinized with the 330 Ohms of $R_{29}$ gives an equivalent resistance of 13.7 Ohms.

Now, by subtracting:

$$50 - 13.7 = 36.3 \text{ Ohms}, \quad (2)$$

which is the value of the sensing resistor $R_{13}$.

The relationship defined in (2) above is necessary in order to have a reflection-free system. Also, it permits the interface circuit 10 to effectively "tune" the test instrumentation with its several feet of co-axial cable connecting with the terminal 12 and avoid the reflection distortion that would otherwise result at the d.u.t. terminal.

The following relationship is used to obtain the optimum gain for the operational amplifier:

$$\text{Op-amp 15 GAIN} = \frac{2(D + AC)}{BD} \quad (3)$$

where:
A = maximum current force to the D.U.T.
B = sensing $R_{13}$ percentage (op-amp out)
C = op-amp output divider's "R" equivalent
D = by-pass diode drop at current A, above

EXAMPLE (1):

200 Ohms output @ 1 milliampere; diode drop = 0.62

$$\frac{2[.62 + (.001)(100)]}{(.72)(.62)} = \frac{2(.62 + .10)}{.4464} = 3.22$$

A gain of 3.00 was selected in this example.

EXAMPLE (2):

51 Ohms output @ 10 milliamperes; diode drop = 0.75

$$\frac{2[.75 + (.01)(29)]}{(.72)(.75)} = \frac{2(.75 + .29)}{.54} = 3.85$$

A gain of 3.83 was available and was selected in this example.

The relationship (3) above is used in order to determine and make a selection of the gain for the operational amplifier 15. That gain is to be, in accordance with the present invention, sufficient to overcome the voltage drop across the bi-pass diodes 25 and 26. In the first example, that gain is 3.0, and therefore, the operational amplifier 15 will furnish the 1 milliampere that would have been lost due to the voltage drop across the diodes in the signal from the test instrumentation connected at the terminal 12.

In accordance with the inerface circuit 10 of the invention, this 1 milliampere is furnished by the operational amplifier 15 directly to the device-under-test, which means that, as a practical matter, the test instrumentation is not connected directly to the device-under-test in either direction. For example, when the device-under-test is dominate and is driving the test instrumentation, it is the input current amplifier 14 that is actually driving the test instrumentation, and when the test instrumentation is dominate and is driving the device-under-test, at quiescence, it is the operational amplifier 15 that is actually driving the device-under-test.

Figure 2:
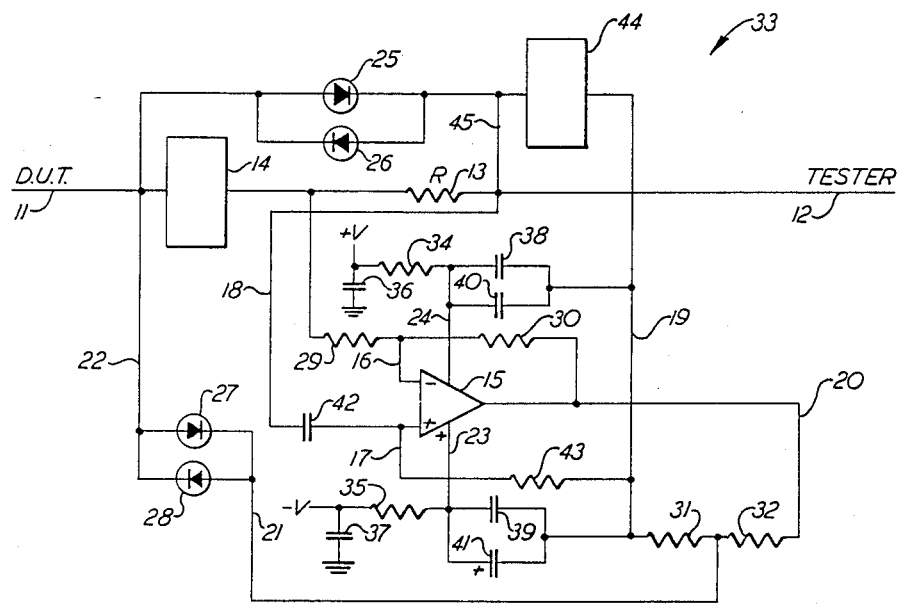
FIG. 2 is a circuit with the primary components of the circuit shown in FIG. 1 and with additional modifications in accordance with another embodiment of the invention.

FIG. 2 of the drawings shows a circuit that is identified generally by the reference numeral 33 but, actually, is the same as the circuit 10 in FIG. 1 but with an improved voltage control network for the operational amplifier 15. In this figure, as in all of the figures, the same reference numerals are used to identify the same or comparable component parts.

There are two exceptions to the above stated general rule, and they concern the resistors 29 and 30, and the resistors 31 and 32 in the two resistors network described in connection with the circuit 10 in FIG. 1. In the circuit 33 of FIG. 2, the resistor 29 is changed to a value of 470 Ohms, the resistor 30 is changed to a value of 1800 Ohms, and the resistors 31 and 32, being identified as 200 Ohms in FIG. 1, are changed to 51 Ohms, respectively, in FIG. 2

Other component parts that are added in the circuit 33 are the resistors 34 and 35. Each of these are 470 Ohms, respectively. The capacitors 36 and 37 are one microfarad each, the capacitors 38 and 39 are 20 microfarads each, the capacitors 40 and 41 are 0.2 microfarads each. The input terminal 17 of the operational amplifier 15 is connected through a 1.1 Nf capacitor 42 to the terminal 12 of the circuit 33, and this same terminal 17 is connected also through a one kilo Ohm resistor 43 to the output of a buffer amplifier 44.

The input of the buffer amplifier 44 is connected by a line 45 to the terminal 12 of the circuit 33 and also to the bi-pass diodes 25 and 26. The supply voltage for the operational amplifier 15 is predetermined and in the present instance is approximately 13 volts. This voltage is connected to the two terminals indicated in FIG. 2 at the junction of the resistor 34 and the capacitor 36 and the resistor 35 and the capacitor 37.

Figure 3:
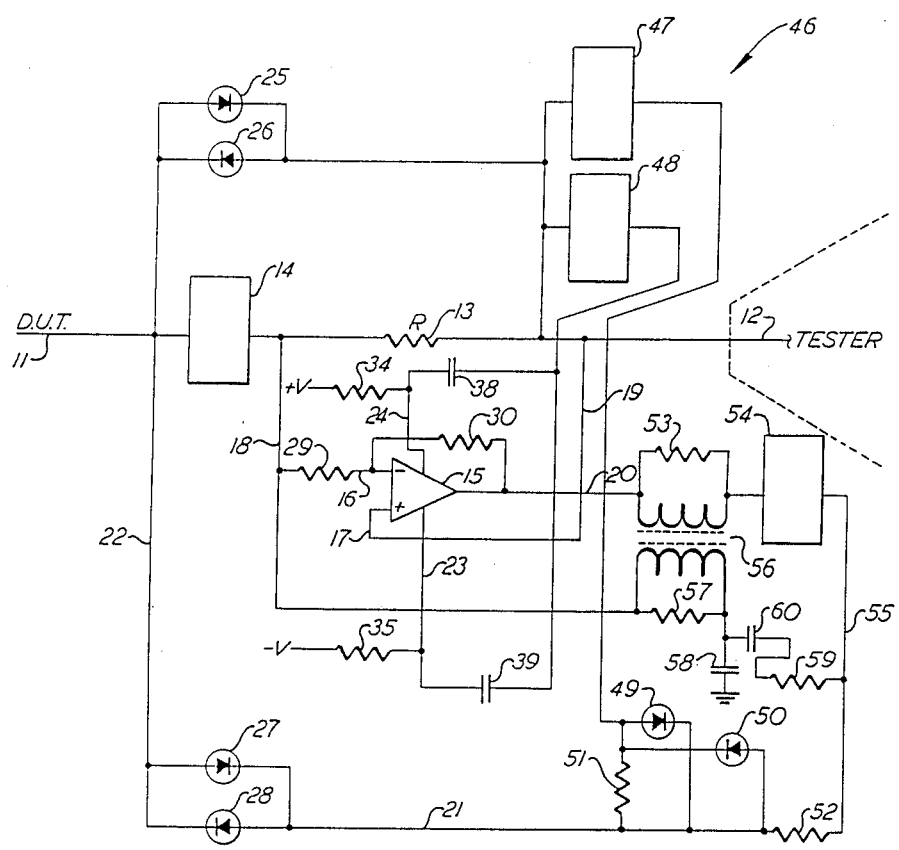
FIG. 3 is a circuit with the primary components of the circuit shown in FIG. 1 and with further modifications to illustrate yet another embodiment of the invention.

Just as the circuit 33 in FIG. 2 indicates that the invention may be modified over that shown in FIG. 1 to function in different environments and to exhibit different improvements, the circuit 46 shown in FIG. 3 illustrates a still further modification. Referring now to FIG. 3, the differences in the circuit 46 over those shown in FIG. 1 and FIG. 2 are primarily in the voltage control circuit to improve still further the common mode voltage tracking for the supply voltage to the operational amplifier 15.

In the circuit 46, there are two bffer amplifiers, identified by the numerals 47 and 48. The buffer amplifiers 47 and 48 both receive their inputs from the test instrumentation connected to the terminal 12, and these inputs are tied also to the bi-pass diodes 25 and 26. The output from the buffer amplifier 47 is connected to a pair of diodes 49 and 50 that are connected in a back-to-back relationship to the input terminal 11 for the device-under-test.

The buffer amplifier 47 functions as a reference sense voltage to control any overshoot by the operational amplifier 15, which makes the diodes 49 and 50 function as overshoot clamp diodes in this circuit. For the benefit of a descriptive chart hereinafter, the buffer amplifier 47 is identified further as "Buffer A".

The buffer amplifier 48 is connected to function as a power steering to remove the common mode part from the input to the operational amplifier 15. Therefore, the output of the buffer amplifier 48 is connected through the 20 microfarad capacitor 39 and the 470 Ohm resistor 35 to the negative terminal of the supply voltage for the operational amplifier 15. Note that there are two 51 Ohm resistors 51 and 52 connected on either side of the overshoot clamp diodes 49 and 50.

A resistor 53 of 470 Ohms is connected in the output line 20 of the operational amplifier 15 between the amplifier 15 and a power buffer amplifier 54, the output of which is connected by a line 55 through the 51 Ohm resistor 52 to the line 21 that leads through the diodes 27 and 28 and the line 22 to the device-under-test connected at the terminal 11.

A transformer 56 is connected across the 470 Ohm resistor 53 and the secondary winding is connected across another 470 Ohm resistor 57, one side of which is connected through the resistor 29 to the input terminal 16 of the operational amplifier 15. The other side of the 470 Ohm resistor 57 is connected through a 100 pico farad capacitor 58 to ground, so that the capacitor 58 functions as an input buffer coupling capacitor. The output of the buffer amplifier 54 is connected by its output line 55 through a 100 Ohm reactive load-isolating resistor 59 and a 100 pico farad power buffer output-coupling capacitor 60 to ground also.

The operational amplifier 15 is not as fast as a digital device. To increase the speed of operation for the operational amplifier 15, it cannot be subjected to common mode transitions. Therefore, the networks that includes the 470 Ohm resistors 34 and 35 along with the larger 20 microfarad capacitors 38 and 39 store energy during such transitions in order to give the operational amplifier 15 the rapid boost in voltage it would need to increase its speed of operations. The buffer amplifier 48 detects such voltage shifts and gives the supply voltage the necessary tie to this condition so that the adjustment can be made.

The operational amplifier 15 is responsive only to the voltage across the sensing resistor 13 in order to amplify it. Therefore, the operational amplifier 15 is connected to function without the analog irregularities usually associated with imperfect high-speed amplifier characteristics.

The two networks that include the resistors 34 and 35 as well as the capacitors 38 and 39 are symetrical in that one of these is connected to the negative supply voltage terminal and an identical network is connected to the positive supply voltage terminal. A center point between the two networks is tied together through the output of the buffer amplifier 44 so that it is driven by both networks.

These two networks with the resistors 34 and 35 and the capacitors 38 and 39 serve to connect the supply voltage to the operational amplifier 15 and function as common mode voltage tracking, which means that the supply voltage can follow "common mode" the signal that the operational amplifier 15 is amplifying. Therefore, because of this, the operational amplifier 15 is not required to have the capability of common mode operations at high frequencies.

While the above-described feature is important and is included within the capabilities of the improvements provided by the circuits 33 and 46 of FIG. 2 and FIG. 3, an even more important feature provided by the circuit of the invention is the low capacitance that it forms between a device-under-test and test instrumentation. This is because the device-under-test (or D.U.T.) is a very small monolithic chip without the capability to drive a lot of capacitance.

The selection of different component values, of course, will provide different current levels and give different offset trade-offs. The three embodiments of the interface circuit of the invention described function in three modes of operation, the details of each being as follows:

A circuit in accordance with the invention has three (3) principal modes of operation, and the following chart describes the function of each component during each mode:

Circuit 46 components:
"FUNCTION"

| MODES OF OPERATION Device-Under-Test to Test Instrumentation no programmed current | |
|---|---|
| Buffer 47 | "none" |
| Buffer 48 | Provide d.c. power steering to op-amp for high speed common mode operation and accuracy |
| Buffer 14 | Take D.U.T. output and drive the test instrumentation and the xformer 56 |
| Buffer 54 | "none" |
| Op-amp 15 | "none" |
| Xformer 56 | Provides in-phase voltage of D.U.T. to buffer 54 for keeping by-pass diode out of conduction |
| Diodes 25 & 26 | "none" |
| Diodes 27 & 28 | "none" |
| Diodes 49 & 50 | "none" |
| Cap. 58 | Provides common return for the xformer 56 |
| Cap. 60 | Provides negative feedback to limit the buffer 54 to a correct voltage level |
| R 13 | "none" |
| R 34 | "Re-initalization" |
| R 59 | Isolates buffer 54 from reactive load |
| R 29 & 30 | Provide precise gain for guiding buffer 54 to keep diodes out of conduction |
| R 52 | Gain attenuator for buffer 54 to maintain diodes 27 & 28 not conducting. |

"FUNCTION"

| "FUNCTION" MODES OF OPERATION Test Instrumentation to D.U.T. no programmed current | |
|---|---|
| Buffer 47 | Provides referenced termination for overshoot by the op-amp 15 and the divider function |
| Buffer 48 | Provides d.c. power steering to op-amp 15 for hi-speed common mode operation & accuracy |
| Buffer 14 | Provides a buffered d.u.t. for operating op-amp 15 via sensing resistor R13 |
| Buffer 54 | Provides trim drive to remove most of the by-pass diodes' voltage drop |
| Op-amp 15 | Amplifies the voltage across the sensing resistor R13 and feeds buffer 54 (to replace diode voltage drop to the device-under-test |
| Xformer 56 | Provides fast trim voltage to buffer 54 in advance of op-amp 15 to provide faster operation |
| Diodes 25 & 26 | Provides a "by-pass" |

"FUNCTION"
MODES OF OPERATION
Test Instrumentation to D.U.T.
no programmed current

| | |
|---|---|
| | for the test instrumentation drive voltage transition to D.U.T. |
| Diodes 27 & 28 | Provides current path for the test instrumentation to D.U.T. for trim |
| Diodes 49 & 50 | Removes any amplifier overshoot from the amplifier's output |
| Cap. 58 | Provides a common return for the xformer 56 |
| Cap. 60 | Provides a negative feedback to limit the buffer 54 to a correct voltage level |
| R 13 | Provides a precise current sense of test instrumentation drive for trim op-amp 15 (current sensed = voltage difference between D.U.T. & test instrumentation divided by 36 ohms) 1/ slew time drive metering 2/ by-pass diode voltage drop sense for trim correction |
| R 34 | Provides D.C. power with A.C. isolation for the op-amp 15 |
| R 59 | Isolates buffer 54 from any reactive load |
| R 29 & 30 | Provides precise gain for guiding buffer 54 to drive through the diodes 27 & 28 (slew & trim drive) |
| R 52 | Gain attenuator for control of overshoot by the buffer 54 and attenuation of trim drive |

"FUNCTION"

"FUNCTION"
MODES OF OPERATION
D.U.T. to Test Instrumentation
current is programmed

| | |
|---|---|
| Buffer 47 | Provides referenced termination for any overshoot by the op-amp 15 and divider function |
| Buffer 48 | Provides d.c. power steering to op-amp 15 for high-speed common mode operation & accuracy |
| Buffer 14 | Provides a buffered d.u.t. for operating trim amplifier 15 via 36 ohm sense resistor R13 |
| Buffer 54 | Provides trim drive for by-pass diodes to force current to d.u.t. |
| Op-amp 15 | Amplifies the voltage across Resistor R 13 and feeds buffer 54 (to provide an appropriate voltage to the by-pass diodes 25 & |

"FUNCTION"
MODES OF OPERATION
D.U.T. to Test Instrumentation
current is programmed

| | |
|---|---|
| | 26 to develop the correct current to the device-under-test) |
| Xformer 56 | Provides in-phase voltage of D.U.T. to buffer 54 for keeping the by-pass diodes at the same level of conduction |
| Diodes 25 & 26 | "none" |
| Diodes 27 & 28 | Provides current from voltage of buffer to D.U.T. (see current translation) |
| Diodes 49 & 50 | "none" |
| Cap. 58 | Provides common return for the xformer 56 |
| Cap. 60 | Provides a negative feedback to limit the buffer 54 to a correct voltage level |
| R 13 | Provide precise current sense of test instrumentation drive for the trim op-amp 15 (current sensed = voltage difference between the D.U.T. & test instrumentation divided by 36 ohms) 1/ translate current of test instrumentation to trim drive to D.U.T. through diode |
| R 34 | Provides D.C. power with A.C. isolation for the op-amp 15 |
| R 59 | Isolates the buffer 54 from a reactive load |
| R 29 & 30 | Provides precise gain for guiding buffer 54 to drive pseudo-current to D.U.T. (diodes 27 & 28 to be kept at partial conduction only) |
| R 52 | gain attenuator for control of overshoot by the op-amp 15 and the buffer 54 and attenuation, to keep a desired current applied to the D.U.T. |

To describe the component functions of a circuit 33, in FIG. 2, that is constructed and arranged in accordance with the present invention, the power of the operational amplifier 15 is isolated from ground, and it is driven by the buffer amplifier 48 (voltage follower), so that; the op-amp 15 does not have to follow the large "common mode" voltage shift of D.U.T.'s logic state changes. This fact allows the op-amp 15 to devote its action entirely to trim "back-fill" activities, i.e., filling in the voltage drop due to the diodes. The capacitors in the power circuit of the op-amp 15 provide "stored" power for the op-amp, since an operational amplifier is not sensitive to slow changes in supply voltages.

In the previously described example, the operational amplifier 15 is used with a gain of 3.0, while its input is signal to trim. This is done so that the high speed decompensated amplifier can perform at a higher speed and can allow isolation resistors on output of the trim op-amp. A D.U.T.'s logic usually has a critical voltage level between logical "1" and "0". However, a circuit in accordance with the invention does not affect the test instrumentation's driver's speed in this instance.

Figure 4:
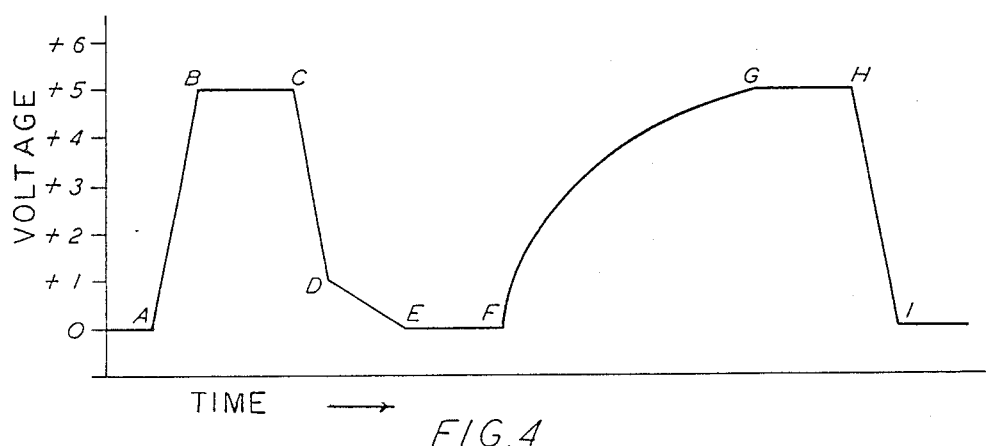
FIG. 4 is a waveform for use in the description to follow for illustrating the performance of the circuit of the invention.

Referring now to FIG. 4 of the drawings, a curve is shown for illustrating the performance of the interface circuit of the invention. While the curve shown in FIG. 4 is positive, it is to be understood that it can just as readily be in the negative direction also.

In FIG. 4, the line A-B illustrates an interval during which the device-under-test (or "D.U.T.") is "dominate", i.e., is doing the controlling; tri-state drive is high, and the line C-D illustrates an interval during which the test instrumentation is "dominate". During the interval D-E, while the test instrumentation is "dominate", the op-amp is active in performing its "back-fill" function, and the interval E-F illustrates a "holding" interval for the "back-fill" circuit. The line F-G illustrates a D.U.T. "dominate", passive "pull-up" interval, as the line H-I illustrates an interval similar to the line A-B, but opposite in polarity.

Although a circuit in accordance with the invention is primarily analog, it is feasible to adapt its use to digital situations, as will be readily understood by those skilled in the art. Moreover, it has been pointed out that the interface circuit of the invention is a high speed analog device that also is bi-directional, and it functions as a buffer to isolate a small device-under-test from harm while permitting such a D.U.T. to be tested.

It has been described hereinabove that the interface circuit of the invention has no control lines, i.e., it is controlled by a functional logic test instrumentation without expensive software, or other, programming and without additional hardware. At first, this feature sounds like the usual sales "puffing", but in this instance, there are significant advantages to be realized. For example, a circuit such as that provided by the invention that has internal "controls" must require time to perform, which slows it own performance time. Electrical switching also adds capacitance, which is the one element that the invention overcomes so readily.

Since a device of the invention is itself small, it can be positioned physically very close to the device-under-test. The ability further decreases the amount of capacitance that must be overcome in order to perform the tests on a monolithic chip. Many other advantages and features will become apparent to one skilled in this art.

The interface circuit of the invention has been shown, described and illustrated in substantial detail, along with several modifications thereof, all with reference to presently preferred embodiments. It is understood that other changes may be made without departing from the spirit and scope of the invention, which is set forth in the appended claims.

What is claimed is:

1. An interface circuit for connecting test instrumentation reflecting at least 100 pico farads of capacitive loading at its terminals, to test a low current monolithic device, said interface circuit comprising:
   input buffer amplifier means with an input terminal connected to a device under test to provide a driving voltage at an output terminal to drive said test instrumentation in response to a voltage output from said low current monolithic device;
   sensing resistance means connected with said input buffer amplifier means for matching, along with an internal resistance of said input buffer amplifier means, a resistance reflected by said test instrumentation; and
   operational amplifier circuit means in said interface circuit connected to drive said monolithic device in response to a voltage across said sensing resistance means that is developed by said test instrumentation.

2. An interface circuit as defined in claim 1 wherein said operational amplifier circuit means has a gain determined by the relationship:

$$\text{GAIN} = \frac{2(D + AC)}{BD}$$

where:
A = maximum current force to D.U.T.
B = sensing resistor percentage (op-amp out)
C = op-amp output divider's "R" equivalent
D = by-pass diode drop @ current A, above.

3. An interface circuit as defined in claim 1 including operating voltage control means connected to be responsive to an output from said test instrumentation to provide common mode voltage tracking for a supply voltage to said operational amplifier circuit means.

4. An interface circuit as defined in claim 3 wherein said operating voltage control circuit functions in accordance with the relationship:

$$V_f = A + BI_f + C \ln I_f$$

where:
$V_f$ = the voltage forward
A = a constant (voltage before conduction)
B = electrical resistance, forward C = a constant, from manufacturer
I = electric current in direction of arrow
ln = natural log function.

5. An interface circuit as defined in claim 3 wherein said operating voltage control circuit means includes a plurality of diodes connected in a predetermined relationship to provide incremental current limited switching for a drive voltage transition from said test instrumentation to said monolithic device.

6. An interface circuit as defined in claim 5 wherein at least some of said plurality of diodes are connected to provide a current control path for said test instrumentation to said monolithic device.

7. An interface circuit as defined in claim 5 wherein at least some of said plurality of diodes are connected as overshoot clamp diodes to remove any overshoot from an output of said operational amplifier circuit means.

8. An interface circuit as defined in claim 3 including another buffer amplifier means connected in said voltage control circuit means to provide a predetermined steering for said supply voltage to said operational amplifier circuit means and to provide a referenced termination for any overshoot.

9. An interface circuit as defined in claim 8 including output buffer amplifier means connected at an output from said operational amplifier circuit means to provide trim drive to remove at least a predetermined portion of a voltage drop in signals from said test instrumentation to said monolithic device.

10. An interface circuit as defined in claim 9 including transformer means connected at the output of said operational amplifier circuit means to provide an in-phase voltage of said monolithic device to said output buffer amplifier means.

11. An interface circuit as defined in claim 10 including by-pass circuit means to provide a predetermined by-pass for test instrumentation drive voltage transition to said monolithic device.

12. An interface circuit as defined in claim 10 including a capacitance means connected with an input side of said output buffer amplifier means to limit said output buffer amplifier means to a desired level.

* * * * *